United States Patent
Kohn et al.

(10) Patent No.: US 7,394,112 B2
(45) Date of Patent: *Jul. 1, 2008

(54) HETEROSTRUCTURE WITH REAR-FACE DONOR DOPING

(75) Inventors: Erhard Kohn, Ulm-Lehr (DE); Ingo Daumiller, Isny (DE); Markus Kamp, Kamp-Lintfort (DE); Matthias Seyboth, Beirnerstetten (DE)

(73) Assignee: MicroGaN GmbH, Ulm (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/324,601

(22) Filed: Jan. 3, 2006

(65) Prior Publication Data

US 2006/0113564 A1 Jun. 1, 2006

Related U.S. Application Data

(63) Continuation of application No. 10/297,234, filed on Feb. 12, 2003, now Pat. No. 7,352,008.

(51) Int. Cl.
*H01L 3/0328* (2006.01)

(52) U.S. Cl. .................. 257/192; 257/94; 257/280; 257/E33.005; 257/E33.068

(58) Field of Classification Search .............. 257/192, 257/280, 83–85, 18, 94
See application file for complete search history.

(56) References Cited

U.S. PATENT DOCUMENTS

| | | | | |
|---|---|---|---|---|
| 6,429,467 | B1* | 8/2002 | Ando | 257/194 |
| 6,515,313 | B1* | 2/2003 | Ibbetson et al. | 257/103 |
| 6,727,531 | B1* | 4/2004 | Redwing et al. | 257/194 |
| 7,268,375 | B2* | 9/2007 | Shur et al. | 257/194 |
| 2002/0190259 | A1* | 12/2002 | Goetz et al. | 257/79 |
| 2006/0102929 | A1* | 5/2006 | Okamoto et al. | 257/189 |

* cited by examiner

*Primary Examiner*—A. Sefer
(74) *Attorney, Agent, or Firm*—Young Basile

(57) ABSTRACT

The present invention relates to a field effect transistor having heterostructure with a buffer layer or substrate. A channel is arranged on the buffer layer or on the substrate, and a capping layer is arranged on the channel. The channel consists of a piezopolar material and either the region around the boundary interface between the buffer layer or substrate and channel or the region around the boundary interface between the channel and capping layer is doped in a manner such that the piezocharges occurring at the respective boundary interface are compensated.

23 Claims, 10 Drawing Sheets

HETEROSTRUCTURE WITH REAR-FACE DONOR DOPING

REFERENCE TO RELATED APPLICATION

This application is a continuation of application Ser. No. 10/297,234, having a filing date of Feb. 12, 2003.

BACKGROUND OF THE INVENTION

The present invention relates to a heterostructure as is for example applied in field effect transistors in power electronics and high temperature electronics. With this, in particular heterostructures which have an In(Ga)N channel, an (Al)GaN capping layer and a GaN buffer layer are used. On account of the material properties of GaN and their compounds such as (Al)GaN and In(Ga)N, these heterostructures have been intensively researched in order to permit applications in power electronics and high temperature electronics.

With heterostructures having an In(Ga)N channel, an (Al)GaN capping layer and a GaN buffer layer or GaN substrate, the In(Ga)N (hereinafter InGaN) channel is stressed on account of the differing lattice constants. On account of the material, by way of this in the GaN/InGaN/GaN system there arise piezoelectric fields, which at the boundary interfaces produce polarized charges (piezocharges). A GaN/InGaN/GaN heterostructure at the same time has a positive boundary interface charge at the InGaN/GaN transition and a negative boundary interface charge at the InGaN/GaN transition (interface). With an indium content of 100%, the produced boundary interface charges may reach a charge carrier density of $1.3 \times 10^{14}$ cm$^{-2}$. The advantage of this structure lies in the fact that the charges produced by the piezoelectric fields are located in the channel. On account of the material properties of GaN there additionally form spontaneous polarization charges on the surface and on the buffer rear-face, which however only have a secondary influence on the transistor properties.

Piezoelectric fields in GaN/InGaN heterostructures play a very important part if these structures are applied as irradiation-emitting semiconductor chips (light diodes). In WO 00/21143, the active layer in such a heterostructure comprises a single- or multi-quantum wave structure. In order to eliminate the influence on the piezoelectric fields in the quantum films, which compromises the irradiation behavior of such semiconductor chips, these fields are eliminated as much as possible by way of doping.

FIG. 1 shows in its part picture 1A such a heterostructure with a buffer 1, with a channel 2, with a capping layer 3 and the boundary interfaces 5 and 6 between the layers 1/2 and the layers 2/3, respectively. Furthermore, the piezocharges are shown wherein one may recognize that the produced positive piezocharge, or piezoinduced positive charges, 10 is located on the boundary interface 5 and the produced negative piezocharge, or piezoinduced negative charges, 11 is located on the boundary interface 6. The piezocharges 10, 11 then move oppositely according to the arrows A and B under the influence of an applied external field E.

From literature there are known modulation-doped (MOD-FET), channel-doped and undoped (piezo-FET) AlGaN/GaN field effect transistors. In the AlGaN/GaN system, stresses also lead to piezoelectric fields that form polarized charges at the boundary interfaces. In contrast to a GaN/InGaN/GaN system, both boundary interface charges are not located in the channel, but the negative charge is located at the AlGaN/GaN interface as 2DEG (2-dimensional electron gas) and the positive charge is located on the AlGaN surface.

The disadvantage of such a structure is the fact that the bonded boundary interface charge at the AlGaN/GaN boundary interface is in interaction with the counter-pole surface charge by way of the polarized fields. The surface charges in DC operation of a GaN-based transistor have little influence on the output characteristics. In RF operation the charge on the surface must follow the channel charge on account of its interaction. Assuming the charges in the channel move at a higher speed than the surface charge, then with a characteristic frequency in RF operation the surface charge no longer follows the channel charge. This now counter-pole, quasi-stationary charge violates the neutrality condition and may now trap the free charges in the channel with the result that the output current reduces and the maximal RF power reduces with respect to the DC power.

In contrast to the AlGaN/GaN system, with the GaN/InGaN/GaN system no boundary interface charge produced by the piezoelectric polarization is located on the sample surface. An interaction between the piezoelectric polarization charge and the surface charge is avoided. By way of this, the effect of current compensation and the resulting power reduction with a high-frequency entry power observed with AlGaN/GaN transistors is reduced.

In a GaN/InGaN/GaN structure, the positive boundary interface charge on the rear-face InGaN/GaN interface and the induced negative boundary interface charge on the GaN/InGaN front-face interface contribute to the transport of current. In comparison to GaN or AlGaN, the electron movability in InGaN is considerably higher and according to theoretical computations may be 4500 cm$^2$/Vsec. The movability of holes in the InGaN is however a multiple smaller than the electron movability. The resulting net current flow given by the positive boundary interface charge and negative boundary interface charge is determined by the condition of the charge neutrality, i.e., the slower hole current determines the resulting cut-off frequency of the component. Furthermore the channel may be blocked by a pn-transition.

It is then the object of the present invention to avoid the above mentioned disadvantages with heterostructures with a channel of a piezopolar.

SUMMARY OF THE INVENTION

This object is achieved by the heterostructure having a substrate with a channel consisting of piezopolar material. The region around the boundary interface between the buffer layer and channel or between the channel and capping layer is doped in a manner such that the piezocharges occurring at the respective boundary interface are compensated. A field effect transistor with the heterostructure has on the surface of the capping structure distant to the channel there are arranged two contact electrodes and a gate electrode. In one embodiment, the doped region is designed as an intermediate layer between the buffer layer or substrate and the channel or between the channel and the capping layer. Advantageous further formations of the present invention are also provided.

DETAILED DESCRIPTION OF THE PREFERRED EMBODIMENT

Figure 1A:
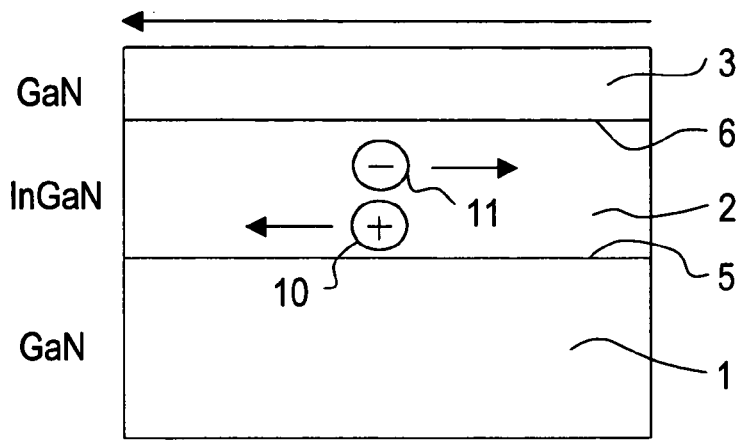
FIG. 1A is a schematic view of a heterostructure.
Figure 1B:
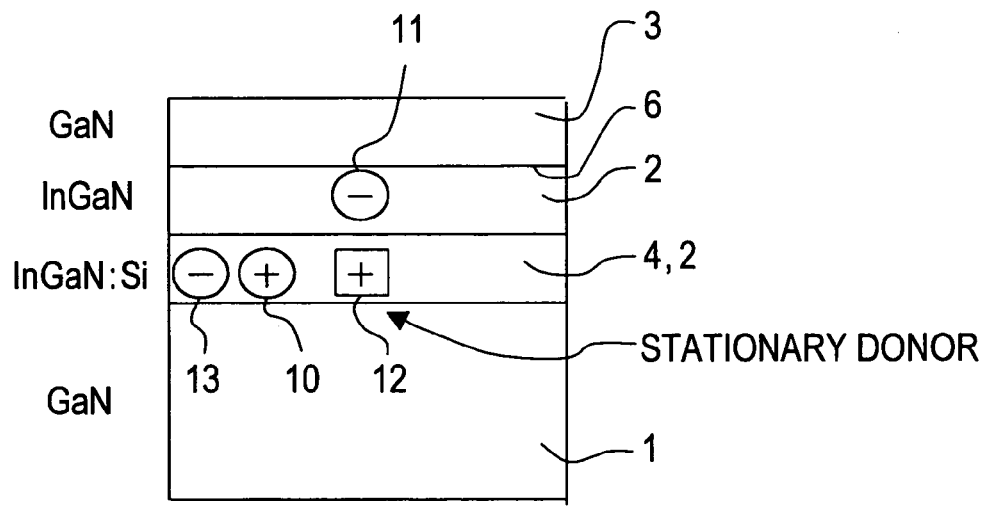
FIG. 1B is a schematic view of a heterostructure with a stationary n-doped donor layer formed in the channel layer at the boundary of the buffer and the channel.

According to the invention for example by way of a thin n-doping in the channel or buffer or substrate the positive polarization charge on the boundary interface between the buffer and channel is compensated so that there results only one electron channel. This is shown with reference to FIG. 1B as well as 1C. FIG. 1B shows how, by way of doping a portion 4.2 of the channel 2 with a stationary donor 12, one may bring movable electrons 13 into the channel 2, which recombine with the piezocharge 10 so that there merely remains the electrons 11 as movable charge carriers in the channel 2.

Figure 1C:
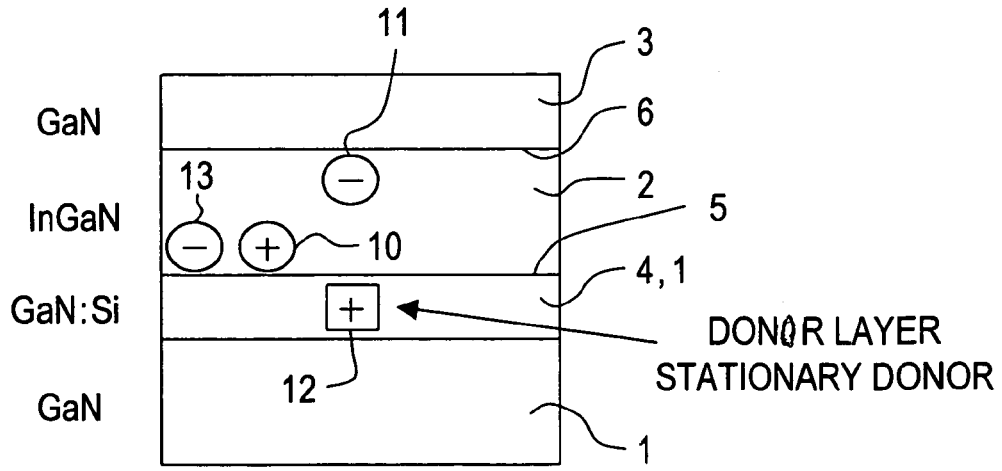
FIG. 1C is a schematic view of a heterostructure with a stationary n-doped donor layer formed in the buffer layer at the boundary of the buffer and the channel.
Figure 2A:
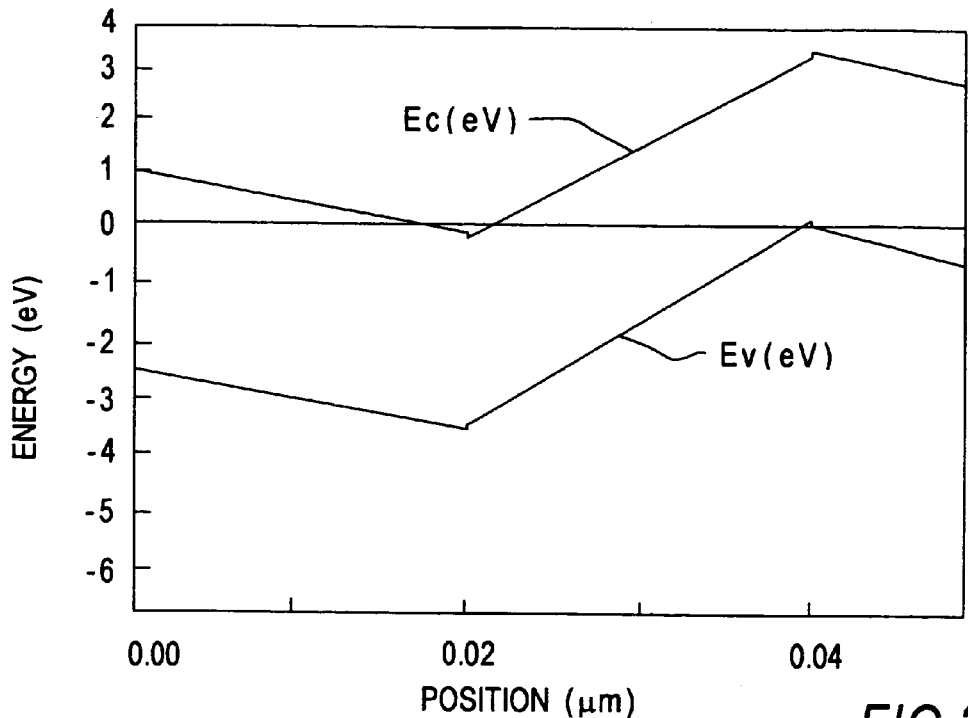
FIGS. 2A and 2B are graphs of a simulated band course and charge carrier distribution, respectively, of the heterostructure according to FIG. 1A with undoped layers and indium content of 20%.
Figure 2B:
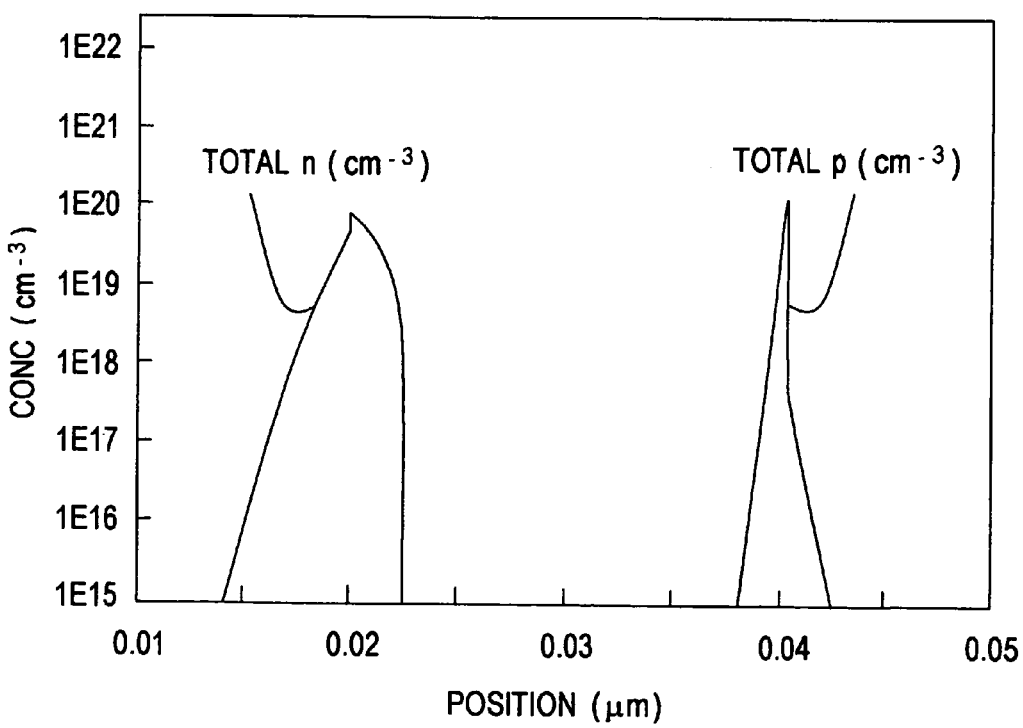
Figure 3A:
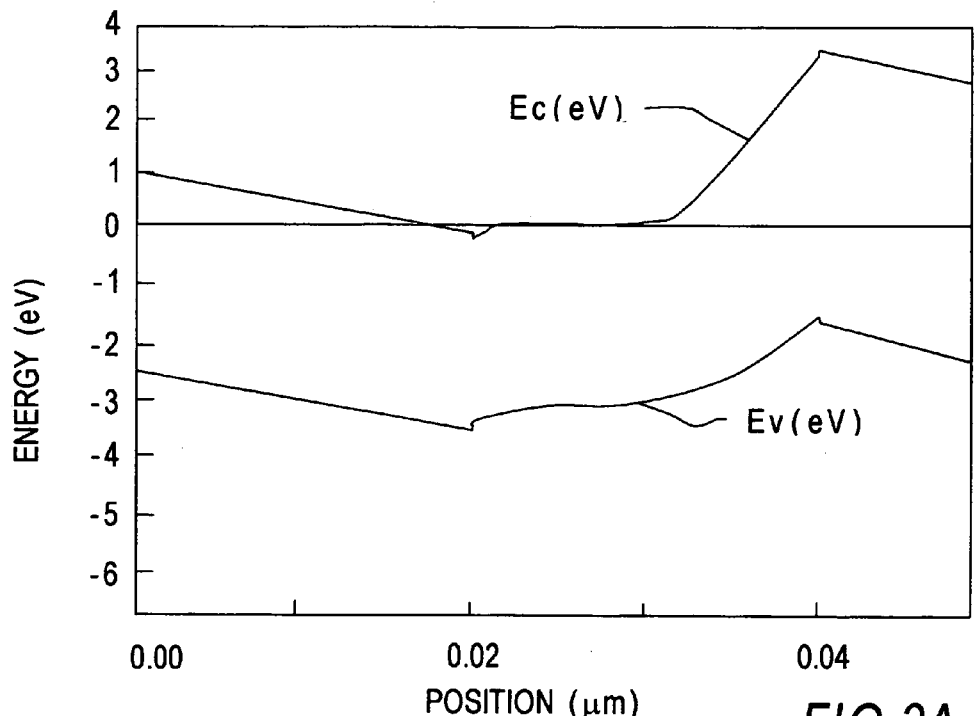
FIGS. 3A and 3B are graphs of a simulated band course and charge carrier distribution, respectively, of the heterostructure according to FIG. 1B with a 10 nm thick N-compensation doping in the InGaN channel.
Figure 3B:
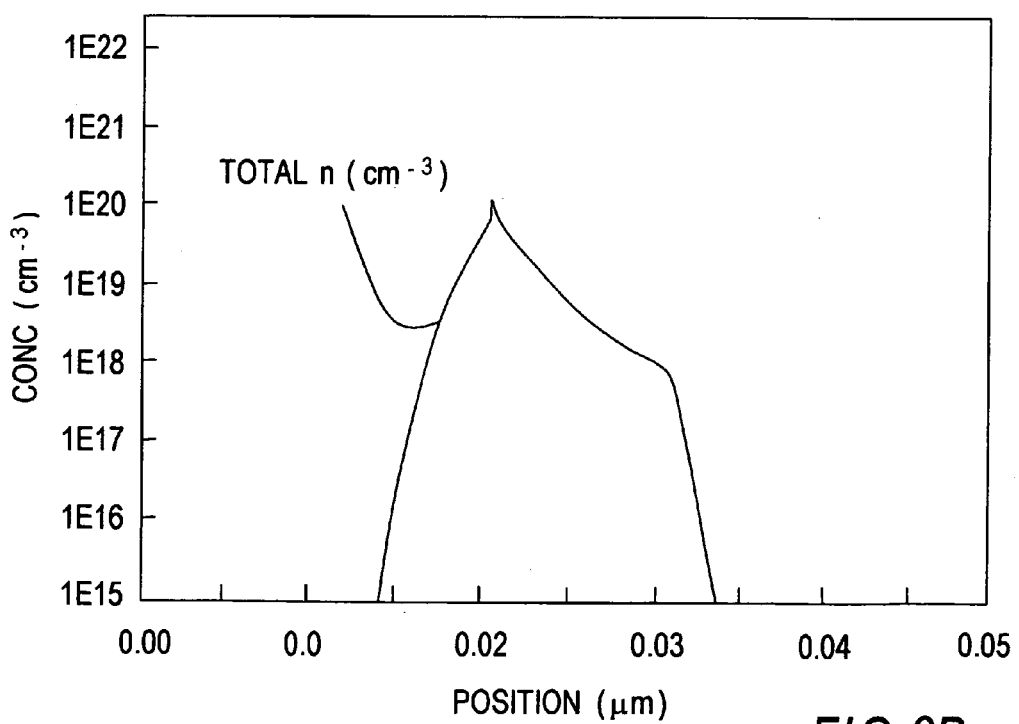

FIG. 1B shows the distribution of the charge on an inverted GaN/InGaN/GaN HEMT structure with donor-doping in the InGaN channel 2. FIG. 1C shows a further possibility, specifically the distribution of the charge on an inverted GaN/InGaN/GaN HEMT structure with donor-doping in the GaN buffer 1. In a similar manner as in FIG. 1B, one may clearly observe the compensation of the positive piezocharge 10 in the channel 2 by the electron modulation doping from the donor layer 4.1, which is a doped region of the buffer 1. As a positive counter charge for the electron channel charge, after recombination of the charge 10 and 13 there merely remains a positive stationary donor charge 12 in the doped donor layer 4.1 of the buffer 1. FIGS. 2A and 2B show the simulated band course in a 20 nm GaN/20 nm InGaN/GaN buffer system and the charge carrier distribution, respectively. For this simulation all layers are undoped and the indium content is 20%. In contrast, FIGS. 3A and 3B show, respectively, the simulated band course and the charge carrier distribution in a GaN/InGaN/GaN system with an n-compensation charge in the InGaN channel 2 as in FIG. 1B. For this simulation a 10 nm thick n-compensation doping ($1.5 \times 10^{19}$ cm$^{-3}$) 4.2 is assumed in the InGaN channel 2.

Figure 4A:
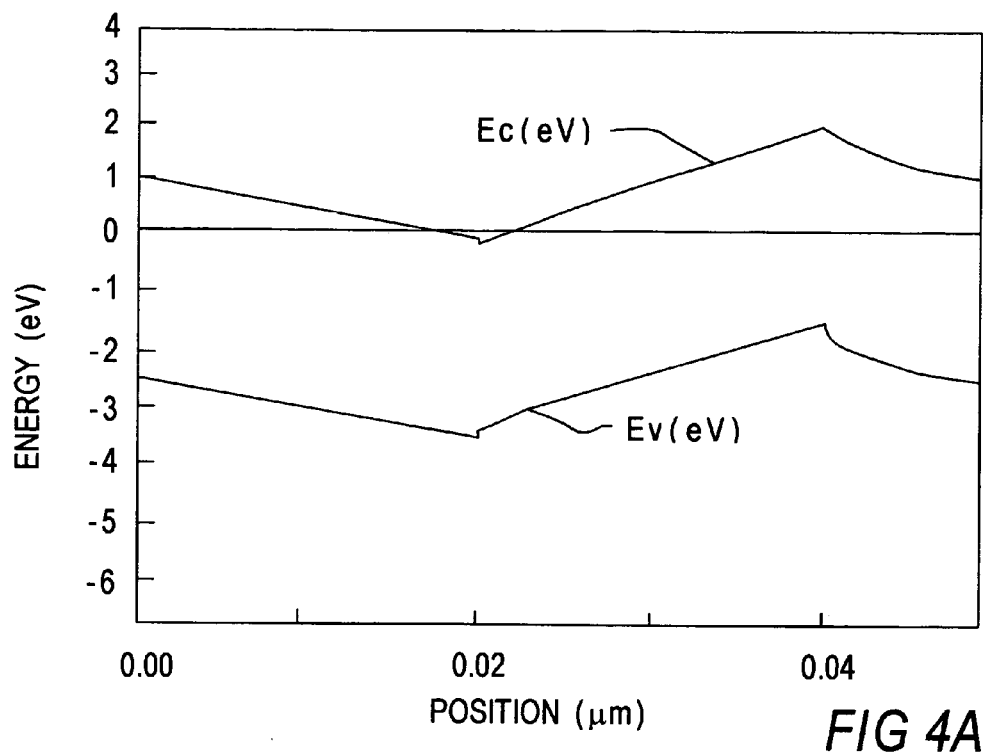
FIGS. 4A and 4B are graphs of a simulated band course and charge carrier distribution, respectively, of the heterostructure according to FIG. 1C with a 10 nm thick N-compensation doping in the GaN buffer below the channel.
Figure 4B:
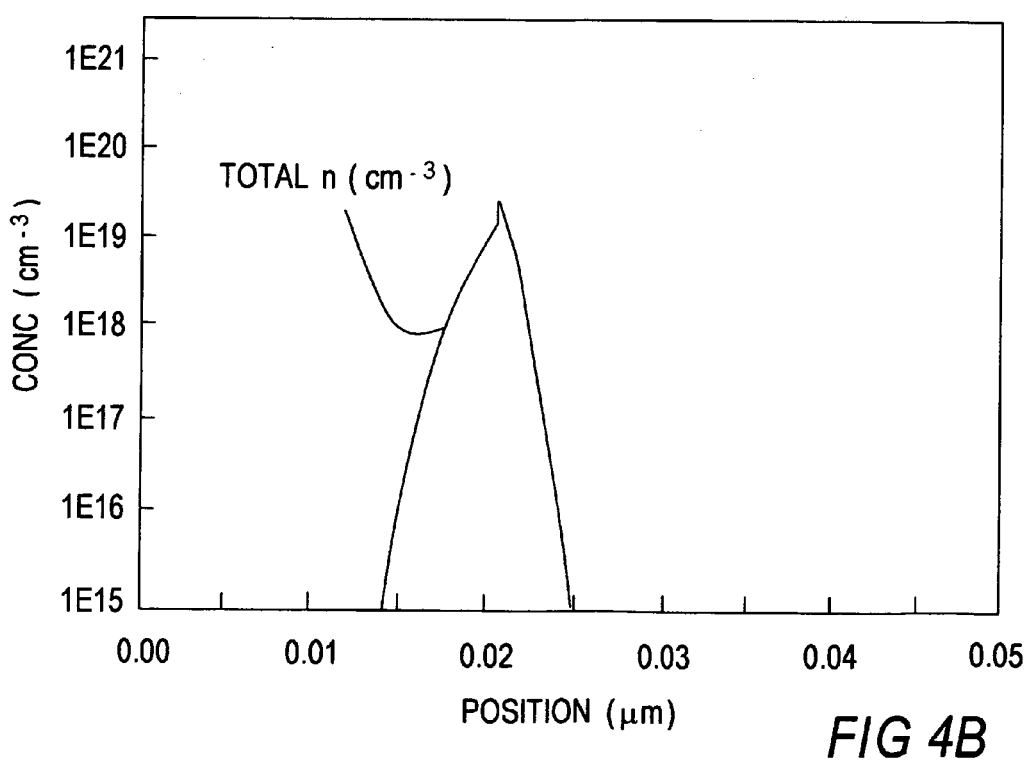

FIGS. 4A and 4B show a corresponding simulation of a system as in FIG. 1C, i.e., with a 10 nm thick n-compensation doping ($1 \times 10^{19}$ cm$^{-3}$) as a donor layer 7.1 in the GaN buffer 1 below the channel 2. In both cases of FIGS. 3 and 4, the doping is chosen exactly such that the hole channel 2 has been compensated.

From FIG. 3B and FIG. 4B, and in comparison to FIG. 2B, it may be directly recognized that the positive piezocharges on the boundary interface between the buffer 1 and channel 2 have been completely compensated and as a result a hole conduction is no longer present in the channel 2.

Figure 5:
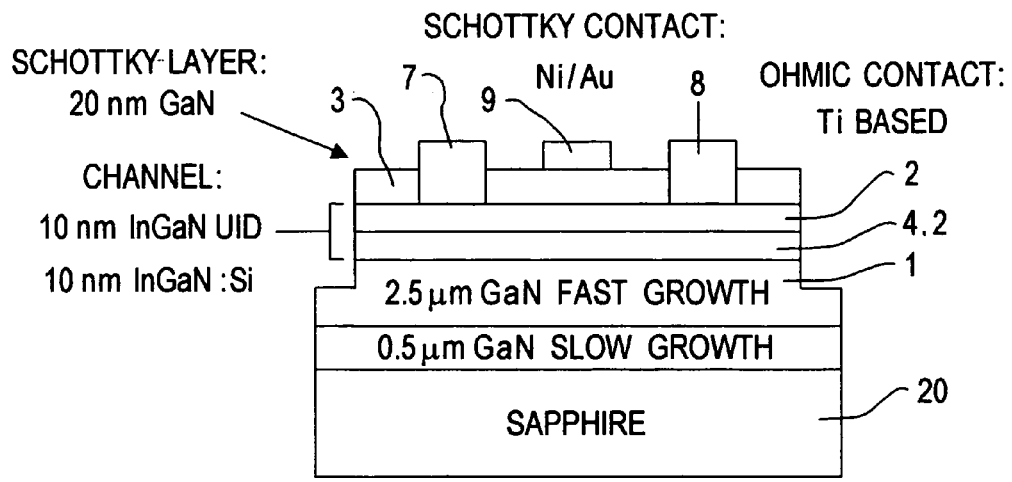
FIG. 5 is a schematic of a layer construction of an inverted Ga/InGaN/GaN field effect transistor with a rear-face donor doping.

FIG. 5 shows the layer construction of an inverted GaN/InGaN/GaN field effect transistor with a rear-face donor doping according to the present invention. Here the doping was effected with silicon as a stationary donor ($2 \times 10^{18}$ cm$^{-3}$) in a 10 nm thick InGaN layer 4.2 that lies at the boundary interface between the channel 2 and the buffer 1. The field effect transistor was deposited on a substrate of sapphire and additionally provided with contact electrodes 7, 8 and a gate electrode 9.

Indium content in the 10 nm undoped InGaN layer of the channel 2 and in the 10 nm thick doped InGaN:Si layer 4.2 is approximately 7%. The 3 μm thick buffer 1 and the 20 nm thick capping layer 3 are in each case undoped.

Figure 6:
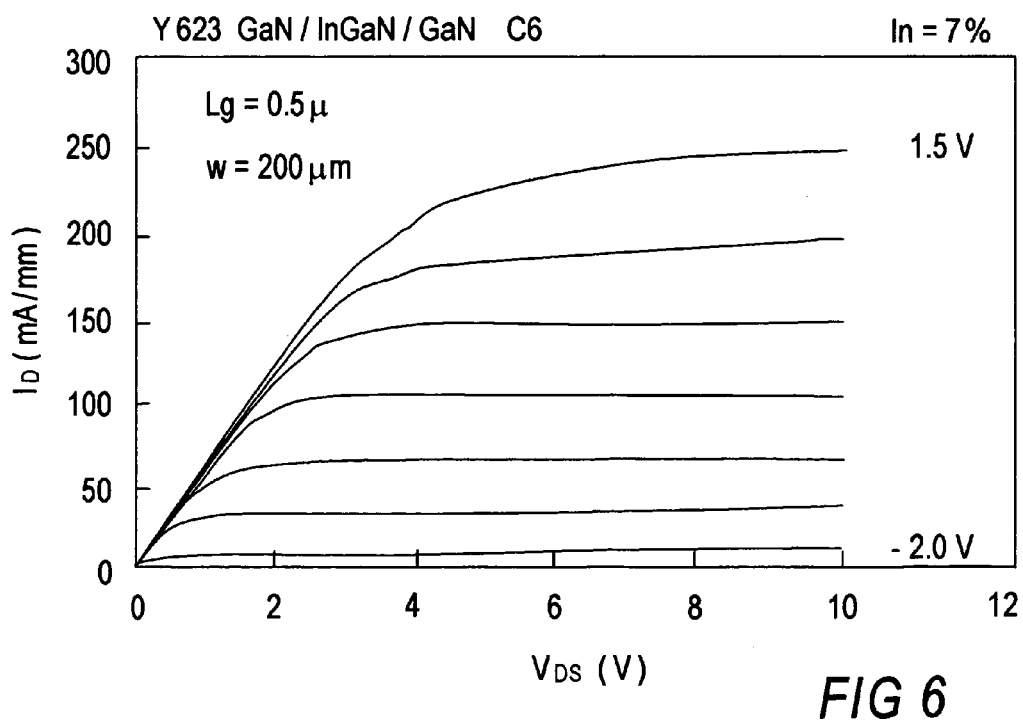
FIG. 6 is a graph of the output characteristics of the FET structure according to FIG. 5.

FIG. 6 shows the output characteristic line of this FET structure with 20 nm GaN undoped as a capping layer 3, 10 nm InGaN undoped as a channel 2, 10 nm InGaN doped ($2 \times 10^{18}$ cm$^{-2}$) as a compensation layer 4.2 with an indium content of 7% and a 3 μm thick GaN buffer layer 1, which is likewise undoped. The gate length was selected at 0.5 μm. With this then a maximal saturation current of 250 mA/mm was achieved.

Figure 7:
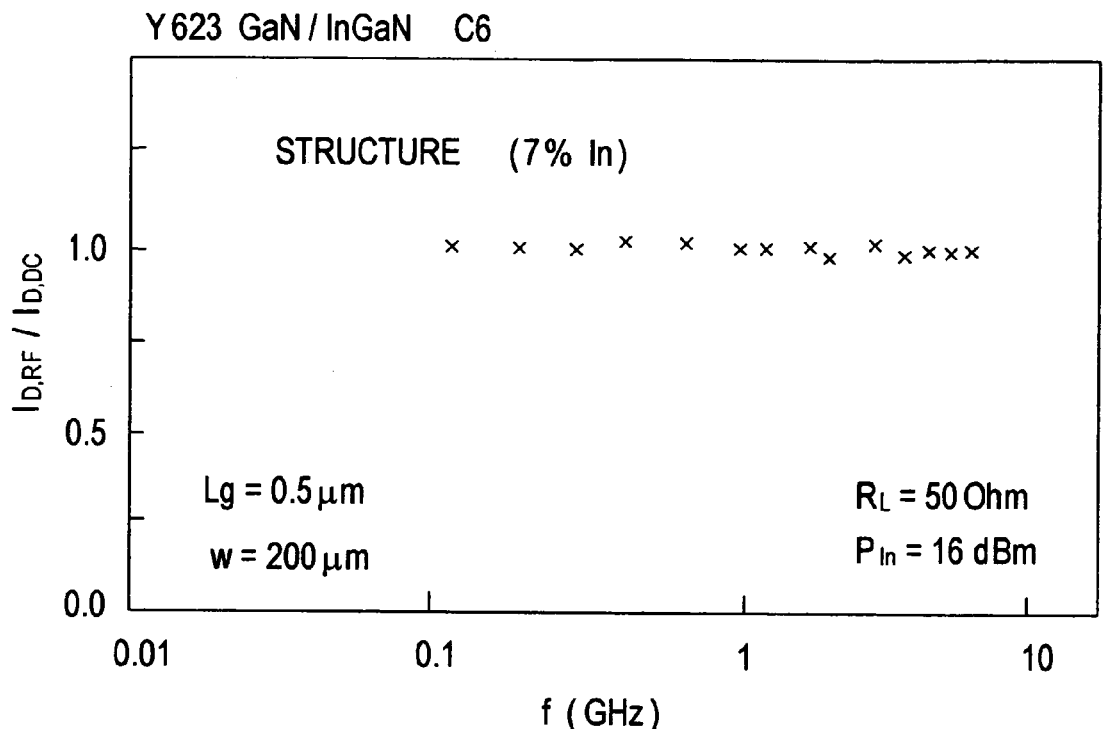
FIG. 7 is a graph of the maximal RF output current normalized to the maximum DC output current of the FET structure according to FIG. 5.

In the pinch condition with such FET, a breakdown voltage of 120 V was achieved. This resulted in an output power of 2.5 W/mm. In RF operation with an entry power of 16 dBm on a 50 Ohm load line up to 10 Hz one could ascertain no current compression. This is represented in FIG. 7, which shows the maximal RF output current normalized to the maximum DC output current depending on the frequency with this FET of FIG. 5.

Figure 8:
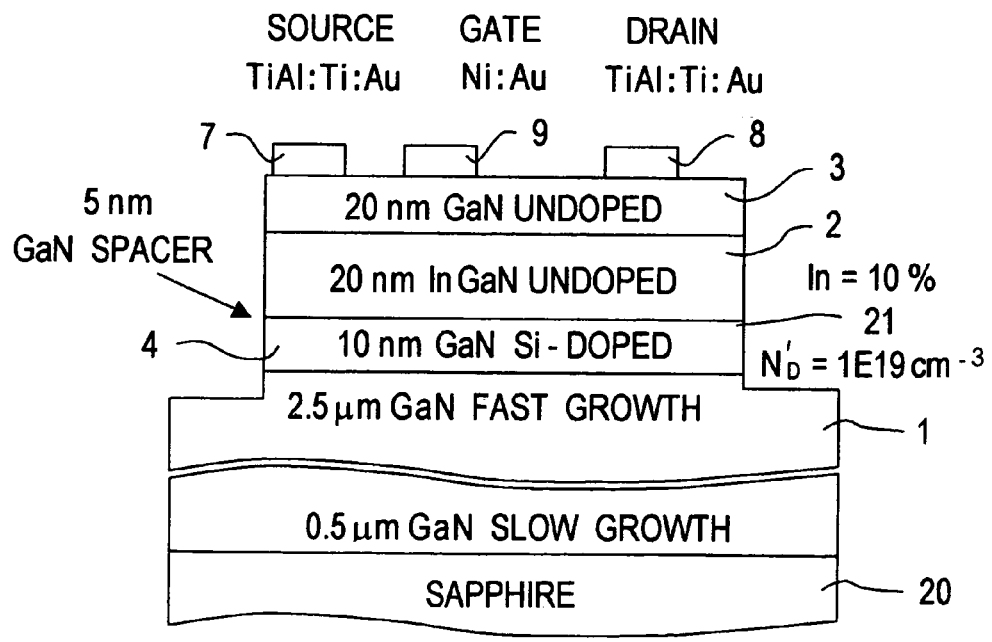
FIG. 8 is a schematic of a layer construction of an inverted InGaN-based HEMT with a rear face donor-doping.

FIG. 8 shows the layer construction of an inverted InGaN-based HEMT with a rear-face donor-doping, which was likewise realized.

Figure 9:
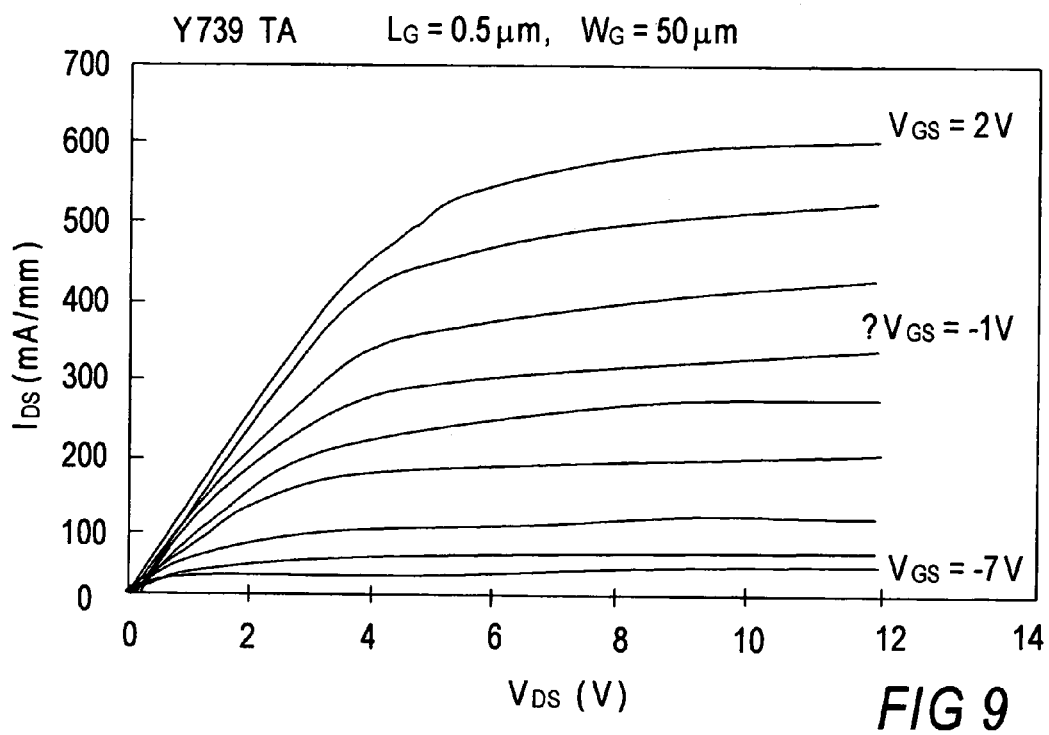
FIGS. 9 and 10 are graphs showing output characteristics of the construction shown in FIG. 8 with various gate lengths.
Figure 10:
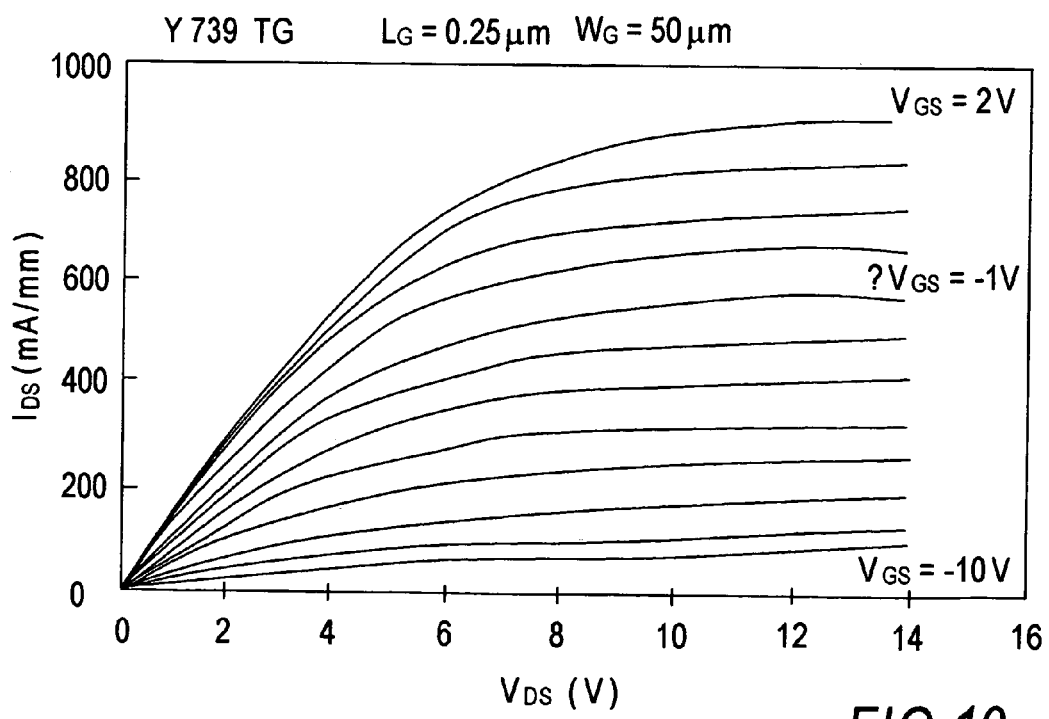

The donor doping of $1 \times 10^{19}$ cm$^{-3}$ is located in a 10 nm thick GaN layer 4 below the InGaN channel 2, separated from it by a 5 nm thick undoped InGaN spacer layer 21 for separating the doping rumps. The indium content in the 20 nm undoped InGaN layer 2 is 10%. The 3 μm thick GaN buffer 1 and the 20 nm thick GaN capping layer 3 are undoped. In FIGS. 9 and 10 the output characteristics of this structure are shown. With a transistor with 0.5 μm gate length (FIG. 9) and with a 0.25 μm gate length (FIG. 10) a maximum saturation current of 600 mA/mm and 900 mA/mm, respectively, was achieved.

Figure 11:
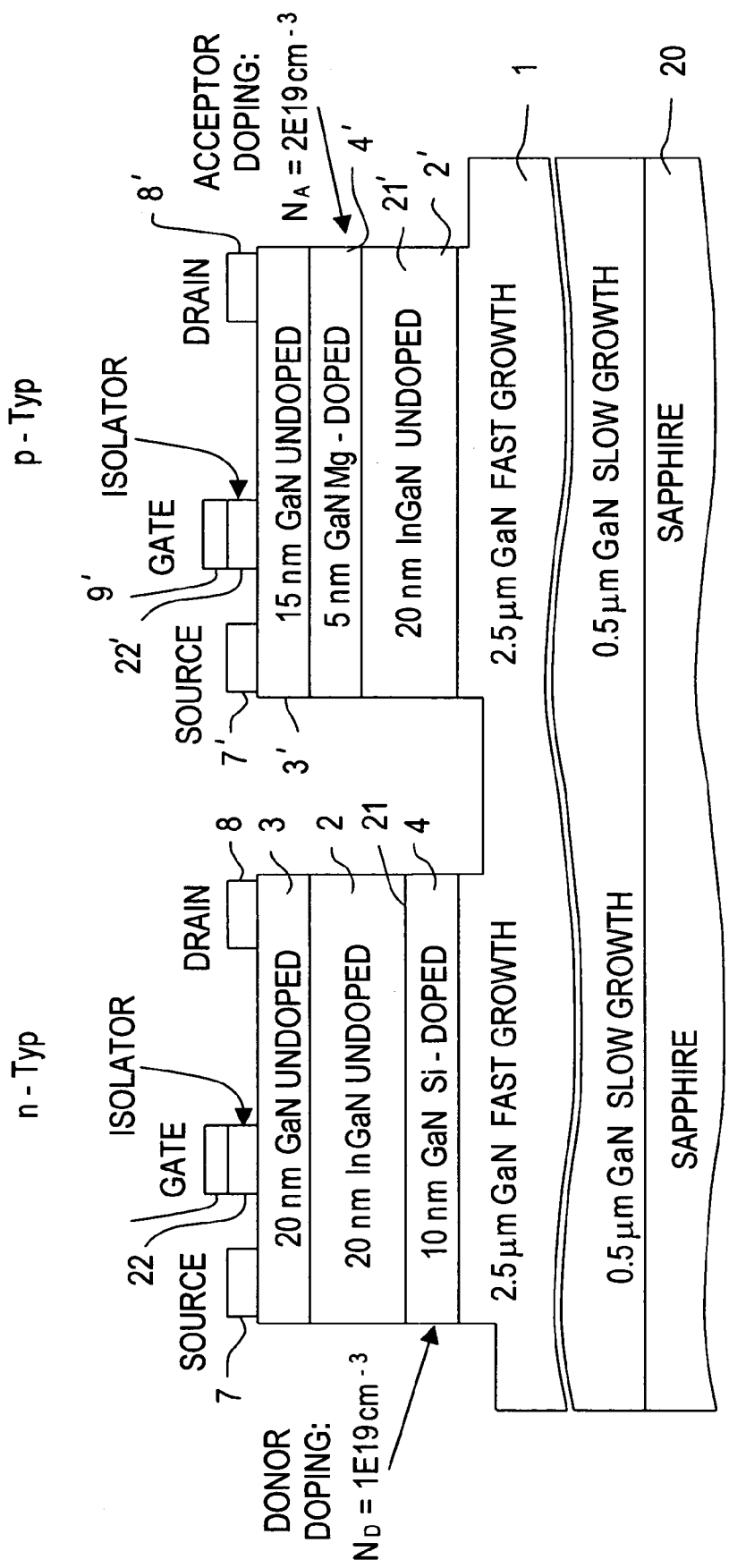
FIG. 11 is a schematic of an invertor with an n-channel and a p-channel of InGaN-based HFET.

With the previous examples, which essentially correspond to FIGS. 1B and 1C, it was shown that by way of the donor compensation doping of the free holes in an InGaN-based inverted HEMT structure there arises a free electron channel. It is however basically also possible to carry out an acceptor compensation doping of the free electrons and thus to produce a free hole channel. This permits complementary logic circuits to be constructed (analogous to CMOS circuit). In FIG. 11 there is shown the construction of such an invertor with an n-channel and a p-channel of InGaN-based HFET. At the same time for the same layers the same reference numerals have been used, wherein in the p-channel system the corresponding reference numerals have been used as reference numerals with an apostrophe (e.g., 3' instead of 3 for the capping layer). The layer construction of the n-channel transistor at the same time corresponds to FIG. 8. The p-channel transistor consists of a 3 μm thick undoped GaN buffer 1, which is in common with the n-channel transistor, a 20 nm thick undoped InGaN layer 2' with 10% indium as a channel 2', a 5 nm thick magnesium-doped GaN layer 4' for compensation doping of the electron channel induced with this with an acceptor concentration of $2 \times 10^{19}$ cm$^{-3}$, and a 20 nm thick undoped GaN-capping layer 3'. In the n-type as well as the p-type transistor between the channel 2, 2' and the doped layer 4, 4' there is located a spacer layer 21 and 21' respectively.

For compensating the two potentials of the n-type transistor or of the p-type transistor below the gate region of the two transistors an isolator 22, 22' for example of $SiO_2$ or SiN is placed between the gates 9, 9' and the semiconductor material of the capping layer 3, 3'.

Figure 12:
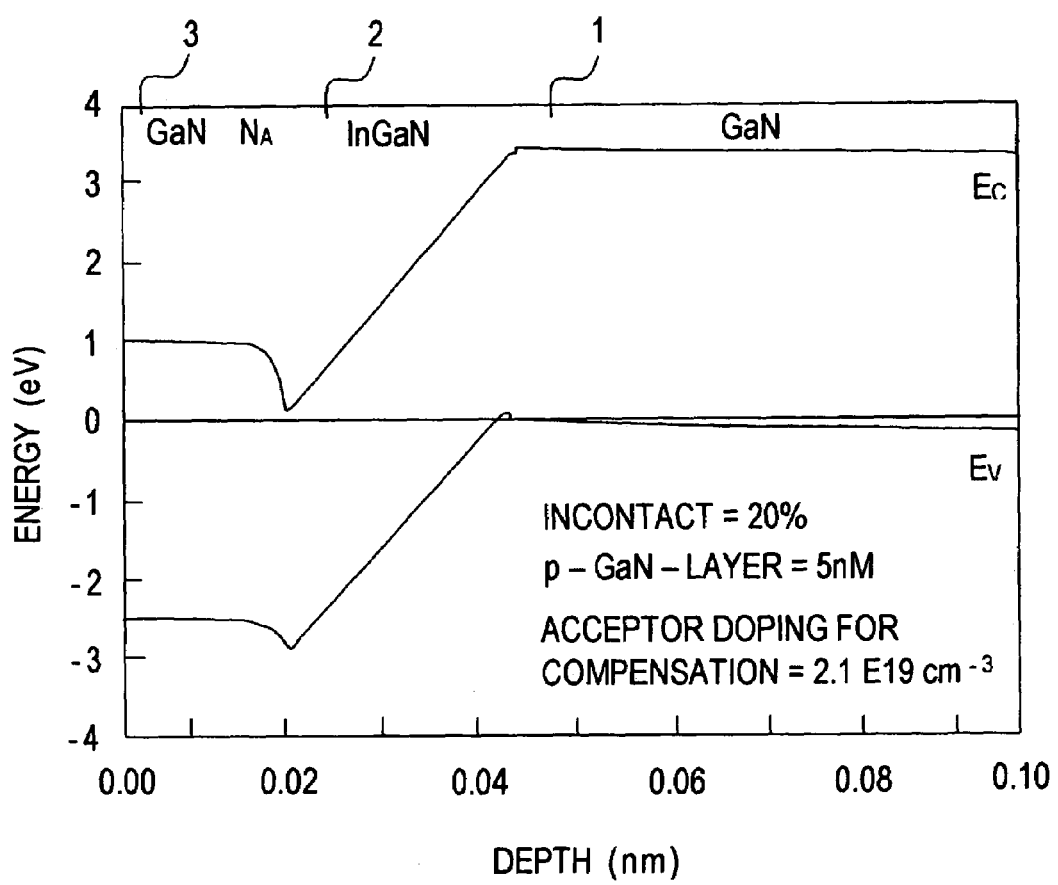
FIGS. 12 and 13 are graphs respectively showing the band course and charge carrier distribution of the p-channel InGaN-based heterostructure with n-compensation doping according to FIG. 11.
Figure 13:
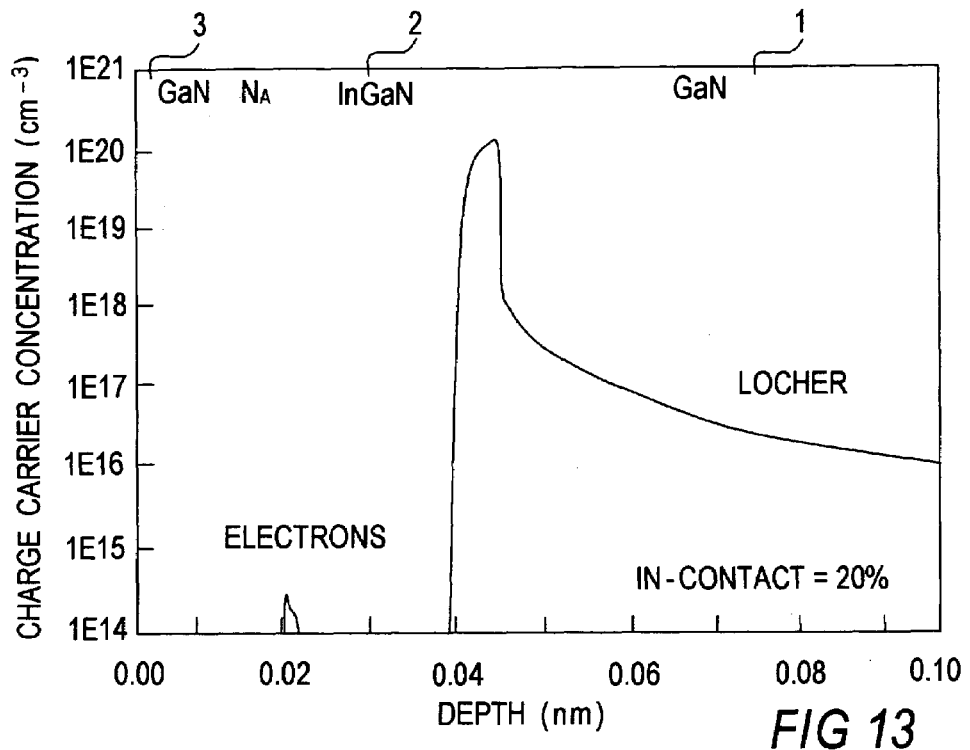
Figure 14:
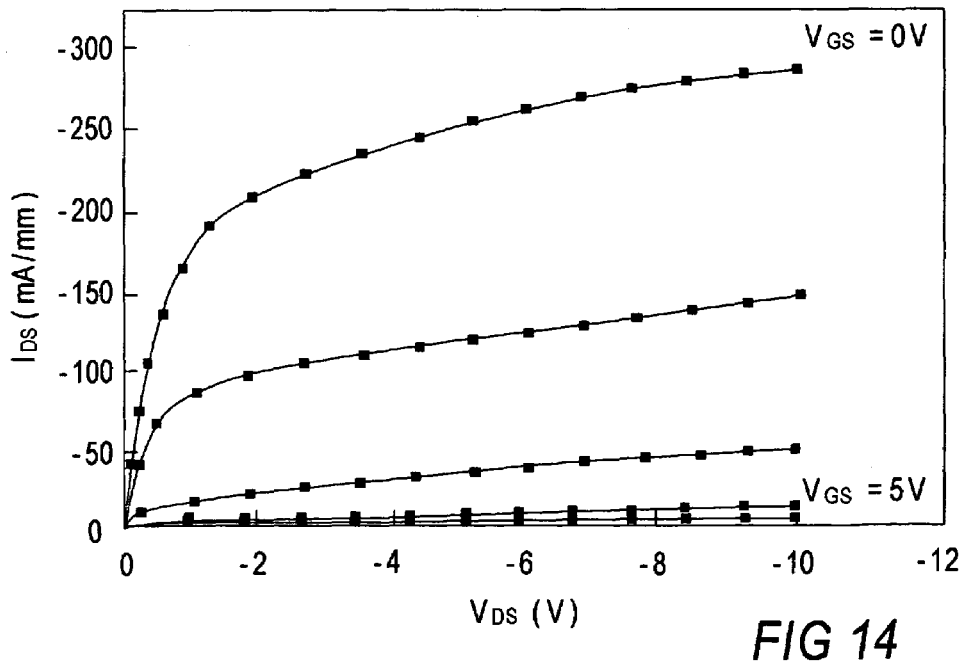
FIG. 14 is a graph of the output characteristic line of the p-channel transistor according to FIG. 11 with 0.5 μm gate length.

FIGS. 12 and 13 show the band course and the charge carrier distribution respectively of a p-channel InGaN-based heterostructure with n-compensation doping shown constructed as in the right part of the picture of FIG. 11. On applying a negative drain source voltage and a positive gate voltage one thus realizes a p-channel transistor. This is shown in FIG. 14 in which the output characteristics line of such a p-channel HEFT with 0.5 μm gate length is shown.

We claim:

1. A field effect transistor comprising:
   a heterostructure including a buffer layer or substrate;
   a channel arranged on the buffer layer or on the substrate;
   a capping layer arranged on the channel wherein the channel consists of a piezopolar material with piezoelectric polarization having two different type piezocharges including piezoinduced positive charges and piezoinduced negative charges; and wherein either the region around the boundary interface between the buffer layer or substrate and channel or the region around the boundary interface between the channel and capping layer, but not both regions, is doped in a manner such that only one type of the piezocharges occurring at the respective boundary interface is compensated; and
   two contact electrodes and a gate electrode arranged on that surface of the capping layer distant to the channel.

2. The field effect transistor according to claim 1 wherein either the region around the boundary interface between the buffer layer or substrate and channel or the region around the boundary interface between the channel and capping layer, but not both regions, is doped in a manner such that only one type of the piezocharges occurring at the respective boundary interface is completely compensated.

3. A field effect transistor according to claim 1 wherein the gate electrode is a Schottky metal gate electrode.

4. A field effect transistor according to claim 1 wherein the gate electrode has a p-doped gate contact.

5. A field effect transistor according to claim 1 wherein the channel is an InGaN layer arranged on the buffer layer or on the substrate; and wherein the indium content in the InGaN layer is between 1% and 99% inclusive.

6. A field effect transistor according to claim 5 wherein the indium content in the InGaN layer is between 5% and 30% inclusive.

7. A field effect transistor according to claim 5 wherein the indium content in the InGaN layer is between 7% and 20% inclusive.

8. A field effect transistor according to claim 5 wherein the indium content in the InGaN layer is 7%, 10% or 20%.

9. A field effect transistor according to claim 1 wherein the region around the boundary interface between the buffer layer or substrate and the channel is n-doped in a manner such that the piezoinduced positive charges present in the channel are compensated.

10. A field effect transistor according to claim 1 wherein the doped region is an intermediate layer between the buffer layer or substrate and the channel or between the channel and the capping layer.

11. A field effect transistor according to claim 10 wherein the intermediate layer is a GaN layer or InGaN layer.

12. A field effect transistor according to claim 10 wherein the intermediate layer comprises a same composition as the corresponding buffer layer or substrate, channel or capping layer neighboring it.

13. A field effect transistor according to claim 1 wherein the doped region is an intermediate layer between the buffer layer or substrate and the channel or between the channel and the capping layer and wherein the thickness of the buffer layer of the substrate is between 1 and 10 μm, of the intermediate layer between 5 and 50 nm, of the channel between 5 and 50 nm and/or of the capping layer between 5 and 50 nm.

14. A field effect transistor according to claim 13 wherein the thickness of the buffer layer or of the substrate is roughly 3 μm; wherein the thickness of the intermediate layer is about 10 nm; and wherein the thickness of the capping layer is about 20 nm.

15. A field effect transistor according to claim 1 wherein the region around the boundary interface between the buffer layer or the substrate and the channel has a donor doping between $1 \cdot 10^{18}$ cm$^{-3}$ and $2 \cdot 10^{19}$ cm$^{-3}$.

16. A field effect transistor according to claim 15 wherein the region around the boundary interface between the buffer layer or the substrate and the channel has a donor doping between $2 \cdot 10^{18}$ cm$^{-3}$ and $1 \cdot 10^{19}$ cm$^{-3}$ inclusive.

17. A field effect transistor according to claim 15 wherein the region around the boundary interface between the buffer layer or the substrate and the channel has a donor doping of $1 \cdot 10^{18}$ cm$^{-3}$ and $2 \cdot 10^{19}$ cm$^{-3}$.

18. A field effect transistor according to claim 1 wherein the doping material for doping the region around the boundary interface between the buffer layer or the substrate and the channel is silicon.

19. A field effect transistor according to claim 1 wherein the region around the boundary interface between the channel and the capping layer has an acceptor doping around between $1 \cdot 10^{18}$ cm$^{-3}$ and $5 \cdot 10^{19}$ cm$^{-3}$.

20. A field effect transistor according to claim 1 wherein the region around the boundary interface between the channel and the capping layer has an acceptor doping between $2 \cdot 10^{18}$ cm$^{-3}$ and $2 \cdot 10^{19}$ cm$^{-3}$.

21. A field effect transistor according to claim 1 wherein the region around the boundary interface between the channel and the capping layer has an acceptor doping of $2 \cdot 10^{19}$ cm$^{-3}$.

22. A field effect transistor according to claim 1 wherein the doping substance for doping the region around the boundary interface between the channel and the capping layer is magnesium.

23. The use of a field effect transistor according to claim 1 for power electronics or high temperature electronics, in field effect transistors or logic circuits, in particular complimentary logic circuits.

* * * * *